US012568636B2

(12) United States Patent
Lin et al.

(10) Patent No.: US 12,568,636 B2
(45) Date of Patent: Mar. 3, 2026

(54) MPS DIODE DEVICE AND PREPARATION METHOD THEREFOR

(71) Applicant: GREE ELECTRIC APPLIANCES, INC. OF ZHUHAI, Zhuhai (CN)

(72) Inventors: Yiren Lin, Zhuhai (CN); Daokun Chen, Zhuhai (CN); Dan Zeng, Zhuhai (CN); Bo Shi, Zhuhai (CN)

(73) Assignee: GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 586 days.

(21) Appl. No.: 18/063,891

(22) Filed: Dec. 9, 2022

(65) Prior Publication Data

US 2023/0105596 A1 Apr. 6, 2023

Related U.S. Application Data

(63) Continuation of application No. PCT/CN2020/140006, filed on Dec. 28, 2020.

(30) Foreign Application Priority Data

Jun. 11, 2020 (CN) .......................... 202010528815.2

(51) Int. Cl.
*H10D 8/60* (2025.01)
*H01L 21/02* (2006.01)
(Continued)

(52) U.S. Cl.
CPC ......... *H10D 8/60* (2025.01); *H01L 21/02378* (2013.01); *H01L 21/02529* (2013.01);
(Continued)

(58) Field of Classification Search
CPC ........ H10D 8/60; H10D 8/051; H10D 62/814; H10D 62/8325; H10D 62/40; H10D 64/62;
(Continued)

(56) References Cited

U.S. PATENT DOCUMENTS 10,403,497 B2 * 9/2019 Fukuda .................. H10D 8/043
2006/0255423 A1 * 11/2006 Ryu ........................ H10D 8/051
257/E29.338
(Continued)

FOREIGN PATENT DOCUMENTS

CN 106298774 A 1/2017
CN 108028285 A 5/2018
(Continued)

OTHER PUBLICATIONS

International Search Report issued in corresponding PCT Application No. PCT/CN2020/140006, dated Mar. 25, 2021.
(Continued)

*Primary Examiner* — Julio J Maldonado
*Assistant Examiner* — Paul A Berry
(74) *Attorney, Agent, or Firm* — Westbridge IP LLC

(57) ABSTRACT

Disclosed are an MPS diode device and a preparation method therefor. The MPS diode device comprises a plurality of cells arranged in parallel, wherein each cell comprises a cathode electrode, and a substrate, epitaxial layer, buffer layer, and anode electrode that are formed in succession on the cathode electrode; two active regions are formed on the side of the epitaxial layer away from the substrate; the width of forbidden band of the buffer layer is greater than the width of forbidden band of the epitaxial layer, and a material of the buffer layer and a material of the epitaxial layer are allotropes; and first openings are formed at the positions in the buffer layer opposite to the active regions, and an ohmic metal layer is formed in the first openings.

16 Claims, 7 Drawing Sheets

(51) Int. Cl.

| | |
|---|---|
| *H01L 21/04* | (2006.01) |
| *H10D 8/01* | (2025.01) |
| *H10D 62/81* | (2025.01) |
| *H10D 62/832* | (2025.01) |
| *H10D 64/62* | (2025.01) |

(52) U.S. Cl.
CPC .. *H01L 21/02576* (2013.01); *H01L 21/02601* (2013.01); *H01L 21/02631* (2013.01); *H01L 21/046* (2013.01); *H01L 21/0485* (2013.01); *H10D 8/051* (2025.01); *H10D 62/814* (2025.01); *H10D 62/8325* (2025.01); *H10D 64/62* (2025.01)

(58) Field of Classification Search
CPC ........ H10D 64/23; H10D 64/64; H10D 8/605; H01L 21/0495; H01L 21/02601; H01L 21/02378; H01L 21/02529; H01L 21/0485
See application file for complete search history.

(56) References Cited

U.S. PATENT DOCUMENTS

| | | | |
|---|---|---|---|
| 2011/0291103 A1 | 12/2011 | Mazzillo | |
| 2014/0209861 A1* | 7/2014 | Okamoto | H10D 30/87 |
| | | | 257/20 |
| 2014/0284620 A1 | 9/2014 | Ota et al. | |
| 2016/0268448 A1* | 9/2016 | Minamisawa | H10D 62/124 |
| 2017/0204532 A1* | 7/2017 | Land | C04B 35/571 |

FOREIGN PATENT DOCUMENTS

| | | | | |
|---|---|---|---|---|
| CN | 109860273 A | 6/2019 | | |
| CN | 110571281 A | 12/2019 | | |
| CN | 212517215 U | 2/2021 | | |
| JP | 2007184382 A | 7/2007 | | |
| JP | 2011071281 A * | 4/2011 | | H10D 8/60 |
| JP | 2014187115 A | 10/2014 | | |
| JP | 2015188066 A | 10/2015 | | |
| JP | 2016171324 A | 9/2016 | | |
| JP | 2018186160 A | 11/2018 | | |
| WO | WO-2009112510 A1 * | 9/2009 | | H10D 30/402 |
| WO | WO-2012060274 A1 * | 5/2012 | | H01L 21/02458 |
| WO | 2013190997 A1 | 12/2013 | | |

OTHER PUBLICATIONS

Written Opinion issued in corresponding PCT Application No. PCT/CN2020/140006, dated Mar. 25, 2021.
Grant Notification issued in counterpart Japanese Patent Application No. 2022-570212, dated Nov. 14, 2023.
Office Action issued in counterpart European Patent Application No. 20939599.5, dated Dec. 10, 2023.
Roccaforte et al., Nanoscale transport properties at silicon carbide interfaces, Journal of Physics D: Applied Physics, 2010, 43, pp. 1-19, dated May 18, 2010.

* cited by examiner

MPS DIODE DEVICE AND PREPARATION METHOD THEREFOR

CROSS-REFERENCE TO RELATED APPLICATIONS

This application is a continuation of International Application No. PCT/CN2020/140006, filed on Dec. 28, 2020, which claims priority to Chinese Patent Application No. 202010528815.2, filed on Jun. 11, 2020. Both applications are incorporated herein by reference in their entireties.

TECHNICAL FIELD

The present application relates to the technical field of electronic devices, and in particular, to an MPS diode device and a preparation method therefor.

BACKGROUND

As a third-generation new semiconductor, SiC has the features of wide band gap, high critical breakdown electric field, and high thermal conductivity. Its applications in the fields of high temperature, high voltage, high frequency, high power present great advantages compared with traditional silicon based devices.

Silicon Carbide Schottky Barrier Diode (SiC SBD) has low forward bias and short reverse recovery time. However, under reverse blocking working conditions, it presents a disadvantage of excessive leakage current. In order to improve the reverse leakage current of SiC SBD, junction barrier Schottky (JBS) or merge pin Schottky (VIPS) structure is developed. On one hand, the depletion region formed at the heavily doped region of the p-type semiconductor can withstand a large reverse bias. On the other hand, the depletion regions are connected to each other and wrap the Schottky junction, which can prevent the increase of reverse leakage caused by the reduction of the Schottky barrier when the device is working in the reverse direction. However, the reverse leakage current and forward operating bias are usually two performance parameters that need to be balanced. In order to reduce the loss from leakage current, it is generously necessary to increase the height of Schottky barrier, but this will lead to the increase of the forward operating bias. Therefore, the related technology cannot decrease the leakage current in the reverse bias direction while reducing device's conduction loss from forward bias direction.

SUMMARY

The present application provides an MPS diode device and a preparation method therefor. The abovementioned MPS diode device can reduce the loss from forward bias conduction while decreasing the loss from the leakage current in the reverse bias direction, so that the two performance parameters of leakage current in the reverse bias direction and forward operating bias can be simultaneously improved, thus achieving a higher performance.

To achieve the above objective, the present application provides the following technical solutions:

A MPS diode device includes a plurality of primitive cells arranged in parallel. Each of the plurality of primitive cell includes a cathode electrode, a substrate, an epitaxial layer, a buffer layer and an anode electrode. The substrate, the epitaxial layer, the buffer layer and the anode electrode are all sequentially formed on the cathode electrode, two active regions are formed on a side of the epitaxial layer away from the substrate, a band gap of the buffer layer is greater than a band gap of the epitaxial layer, and material of the buffer layer and material of the epitaxial layer are allotropes, and a first hole is arranged in a part, corresponding to the active region of the buffer layer, and an ohmic metal layer is disposed in the first hole.

In the abovementioned MPS diode device, a buffer layer is disposed between the epitaxial layer and the anode electrode, and the band gap of the buffer layer is larger than the band gap of the epitaxial layer, thus, modulation of Schottky barrier height in the MPS diode device can be realized and as a result, the height of the Schottky barrier can be reduced. Consequently the conduction loss in the forward bias direction of the MPS diode device can be reduced. At the same time, since the buffer layer is made of a allotropic material with the epitaxial layer the stress problem from lattice mismatch at the interface between the buffer layer and the epitaxial layer can be greatly improved, thus the interface state can be greatly reduced and the leakage current in the reverse bias direction of the MPS diode device can also be reduced. In the abovementioned MPS diode device, the conduction loss in the forward bias direction is reduced while the loss from leakage current in the reverse bias direction is also decreased. Thus the two performance parameters of leakage current in the reverse bias direction and forward working bias can be improved at the same time. As a result, the performance of the MPS diode device is enhanced.

In some embodiments, the buffer layer is a nanostructure layer.

In some embodiments, the buffer layer is a quantum dot layer.

In some embodiments, a shape of quantum dot in the quantum dot layer is cylindrical, spherical or convex, and when the quantum dot is in a shape of cylindrical, a bottom surface of the quantum dot contacts with the epitaxial layer; when the quantum dot is in a shape of convex, the quantum dot includes a tangent plane perpendicular to a direction of the epitaxial layer, and a shape of a contour line on a side of the tangent plane away from the epitaxial layer is in a shape of a parabola.

In some embodiments, a material of the substrate is n-type 3C—SiC, a material of the epitaxial layer is n-type 3C—SiC, and a doping concentration of the substrate is higher than a doping concentration of the epitaxial layer; a material of the buffer layer is 4H—SiC.

In some embodiments, a material of the ohmic metal layer is titanium.

In some embodiments, a thickness of the ohmic metal layer is 1 um.

The present application provides a preparation method of an MPS diode device, the preparation method includes: forming an epitaxial layer on a substrate, wherein a side of the epitaxial layer away from the substrate includes an active layer formation region for forming an active region; forming an active region in the active formation region; annealing treatment; forming a buffer layer on a side of the epitaxial layer away from the substrate, and a band gap of the buffer layer being greater than a band gap of the epitaxial layer; patterning a part of the buffer layer corresponding to the active region to form a first hole passing through the buffer layer; forming an ohmic metal layer in the first hole; forming a cathode electrode on a side of the substrate away from the epitaxial layer; and forming an anode electrode on a side of both of the buffer layer and the ohmic metal layer away from the epitaxial layer.

In some embodiments, the forming the active region in the active layer formation region includes: forming a sacrificial oxide layer on a surface of the epitaxial layer away from the substrate; forming a barrier layer on a side of the sacrificial oxide layer away from the epitaxial layer; patterning a part of the barrier layer corresponding to the active layer formation region to form a second hole passing through the barrier layer; implanting ions into the second hole to form an active region in the active layer formation region of the epitaxial layer; and removing the sacrificial oxide layer and the barrier layer to expose the epitaxial layer.

In some embodiments, the ions are aluminum ions.

In some embodiments, a material of the substrate is n-type 3C—SiC, a material of the epitaxial layer is n-type 3C—SiC, and a doping concentration of the substrate is higher than a doping concentration of the epitaxial layer; a material of the buffer layer is 4H—SiC.

In some embodiments, the annealing treatment includes: forming a carbon film on a side of the epitaxial layer away from the substrate; performing a high temperature annealing treatment; and removing the carbon film to expose the epitaxial layer.

In some embodiments, the buffer layer is a quantum dot layer.

In some embodiments, the quantum dot layer is prepared by: growing a buffer film layer on a side of the epitaxial layer away from the substrate by a sublimation method at a temperature higher than 2000° C.; and subjecting the buffer film layer to annealing treatment to form the quantum dot layer.

DETAILED DESCRIPTION OF THE EMBODIMENTS

The technical solutions in the examples of the present application will be clearly and completely described below with reference to the accompanying drawings in the examples of the present application. Obviously, the described examples are only a part of the examples of the present application, but not all of the examples. Based on the examples in the present application, all other examples obtained by those of ordinary skill in the art without creative efforts shall fall within the protection scope of the present application.

Figures 5, 6:
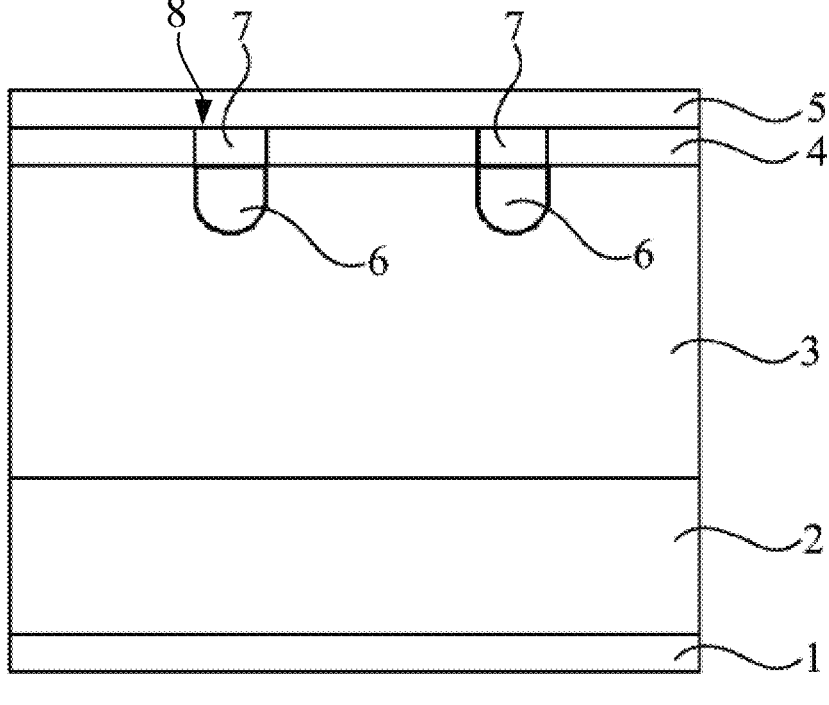
FIG. 6 is a cross-sectional schematic diagram of a first quantum dot structure provided in an example of the present application.

Referring to FIG. 5, the present application provides an MPS diode device including a plurality of primitive cells arranged in parallel.

Each of the plurality of primitive cell includes a cathode electrode 1 and a substrate 2, an epitaxial layer 3, a buffer layer 4 and an anode electrode 5. The substrate 2, the epitaxial layer 3, the buffer layer 4 and the anode electrode 5 are all sequentially formed on cathode electrode 1. Two active regions 6 are formed on the side of epitaxial layer 3 away from substrate 2. A band gap of buffer layer 4 is larger than a band gap of epitaxial layer 3 and material of the buffer layer 4 and material of the epitaxial layer 3 are allotropes. A first hole 8 is arranged in a part corresponding to the active region 6 in the buffer layer 4, and an ohmic metal layer 7 is disposed in the first hole 8.

In the abovementioned MPS diode device, a buffer layer 4 is disposed between the epitaxial layer 3 and the anode electrode 5, and the band gap of the buffer layer 4 is larger than the band gap of the epitaxial layer 3, thus the modulation of Schottky barrier height in the MPS diode device can be realized, and the Schottky barrier height can be reduced, thereby the forward conduction loss of the MPS diode device can be reduced; at the same time, since the buffer layer 4 is made of a allotropic material with the epitaxial layer 3, the stress problem from lattice mismatch at the interface between the buffer layer 4 and the epitaxial layer 3 can be well improved, thus the interface state can be greatly reduced, and the reverse leakage current of the MPS diode device can also be reduced. In the abovementioned MPS diode device, the reverse leakage loss is reduced while reducing the forward conduction loss is also decreased, thus the two performance parameters of leakage current in the reverse bias direction and forward working bias at the same time. As a result, the performance of the MPS diode device can be enhanced.

Specifically, the buffer layer 4 is a nanostructure layer.

The buffer layer 4 can be a thin film layer or a nanostructure layer. By adopting the nanostructure layer, the energy band width of the buffer layer 4 can be further adjusted, such that the Schottky barrier height can be further modulated, thereby reducing the forward conduction loss of the device.

Figure 7:
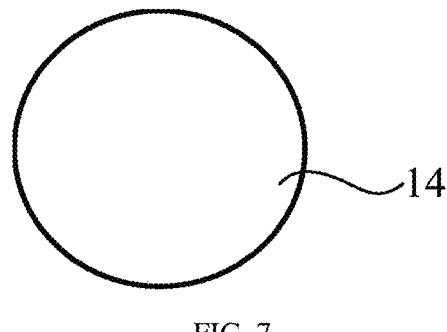
FIG. 7 is a cross-sectional schematic diagram of a second quantum dot structure provided in an example of the present application.
Figure 8:
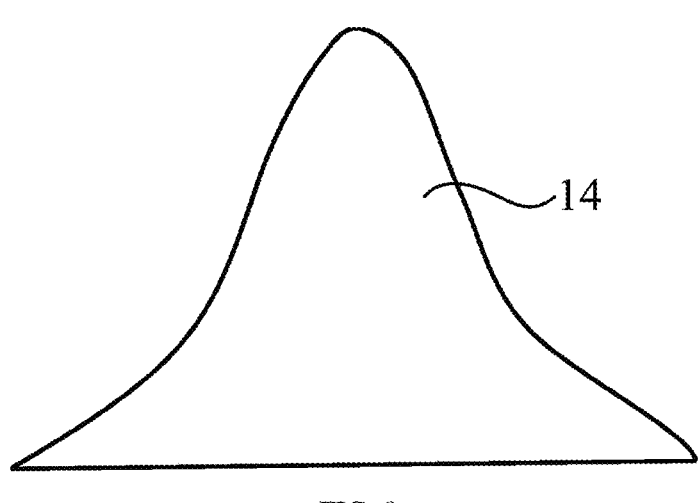
FIG. 8 is a cross-sectional schematic diagram of a third quantum dot structure provided in an example of the present application.

Specifically, the buffer layer 4 is a quantum dot layer. As shown in FIG. 6, FIG. 7 and FIG. 8, the shape of the quantum dot in the quantum dot layer is cylindrical, spherical or convex. When the quantum dot is in a shape of cylindrical, a bottom surface of the cylindrical quantum dot contacts with the epitaxial layer 3; when the quantum dot is in a shape of convex, the quantum dot includes a tangent plane perpendicular to a direction of the epitaxial layer, and a shape of a contour line on a side of the tangent plane away from the epitaxial layer is in a shape of a parabola.

The buffer layer 4 can adopt a nano-scale quantum dot layer, which is easy to prepare and the shape and size of the quantum dots in the quantum dot layer can be controlled by the annealing temperature during the preparation process, so as to adjust the band gap of the buffer layer 4, Thereby, the Schottky barrier height can be further adjusted, so that the MPS diode device can achieve better performance.

Specifically, material of the substrate 2 is n-type 3C—SiC, material of the epitaxial layer 3 is n-type 3C—SiC, and a doping concentration of substrate 2 is higher than a doping concentration of the epitaxial layer 3; and material of buffer layer 4 is 4H—SiC.

The material of buffer layer 4 is 4H—SiC, and the material of epitaxial layer 3 is n-type 3C—SiC. Since the band gap of 4H—SiC is larger than the band gap of 3C—SiC, the modulation of the Schottky barrier height can be realized. And since 4H—SiC and 3C—SiC are allotropic structures, compared with using other wide band gap semiconductor materials when adopting 4H—SiC as buffer layer 4, the stress problem from lattice mismatch at the interface between the epitaxial layer of 3C—SiC material and the buffer layer of 4H—SiC can be well improved, thus the interface states can be greatly reduced, which alleviates the problem of excessive reverse leakage resulted from the interface state.

Specifically, a material of the ohmic metal layer 7 is titanium.

Specifically, a thickness of the ohmic metal layer 7 is 1 um.

Figure 1:
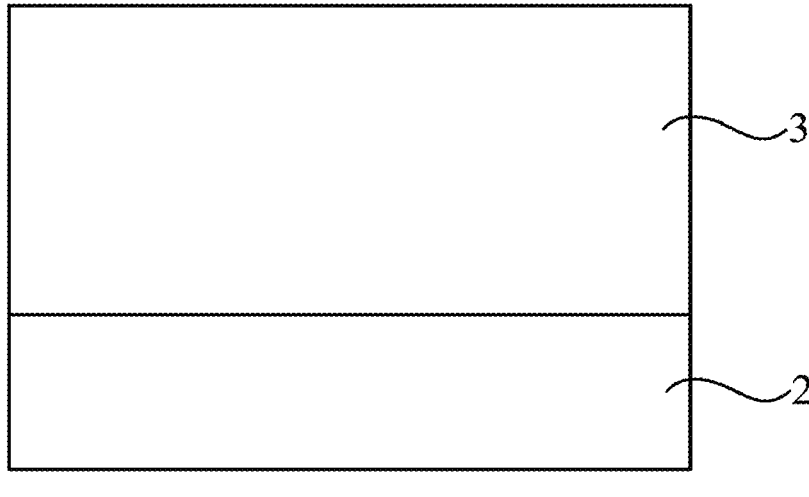
FIGS. 1 to 5 are schematic diagrams of a preparation method of an MPS diode device according to an example of the present application.
Figure 2A:
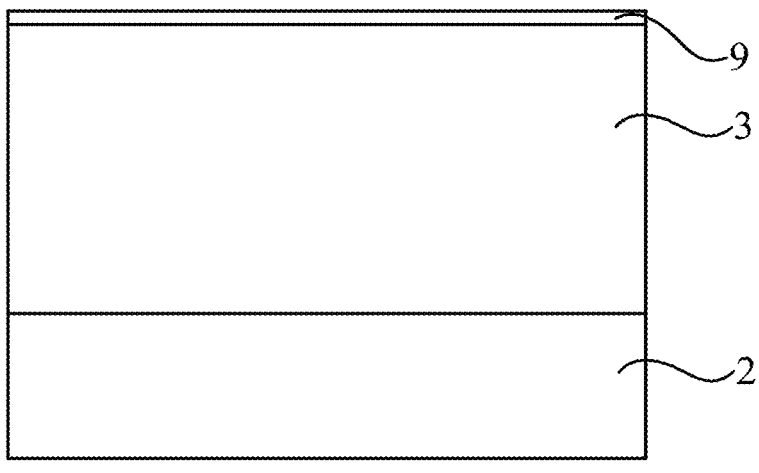
Figure 2B:
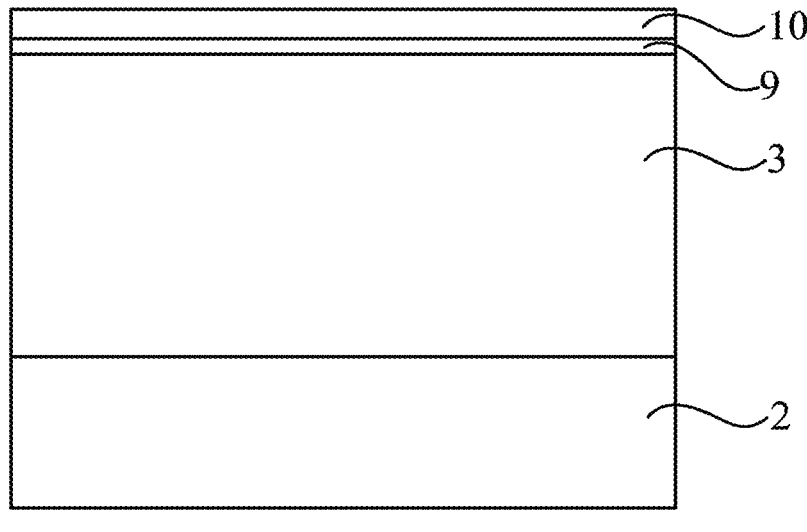
Figure 2C:
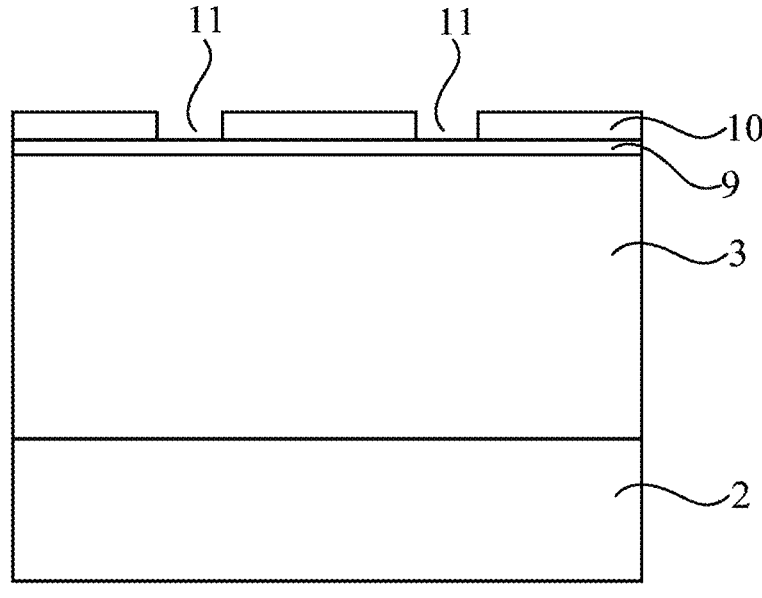
Figure 2D:
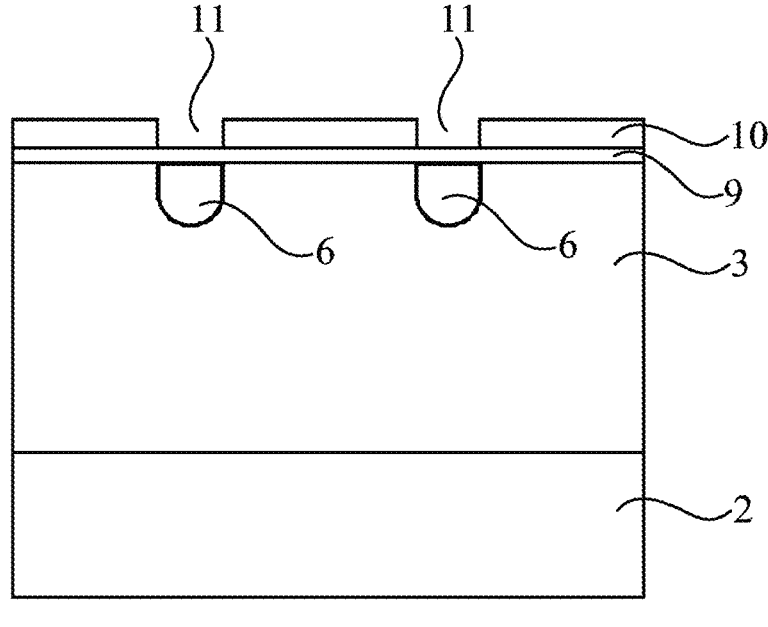
Figure 2E:
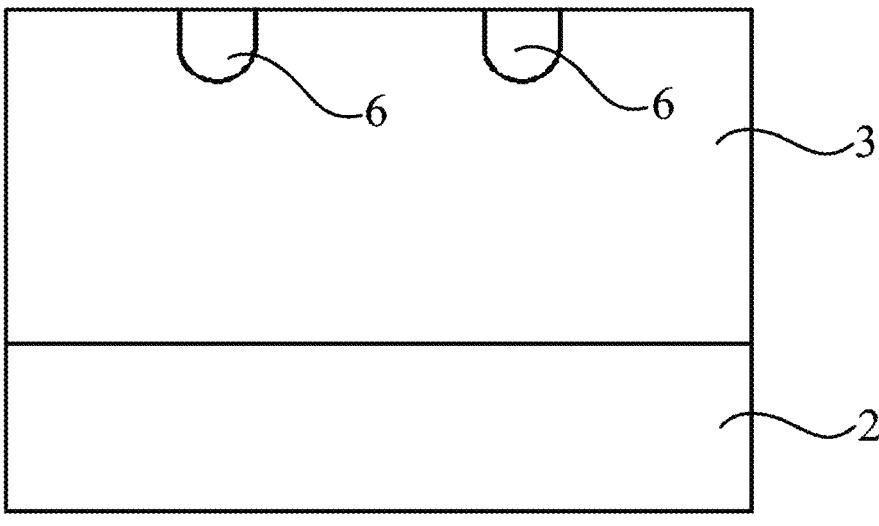
Figure 3:
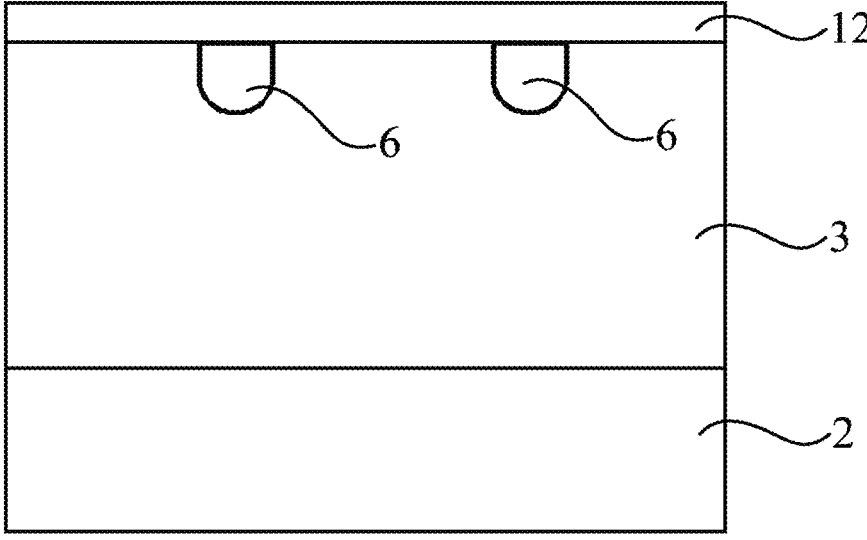
Figure 4A:
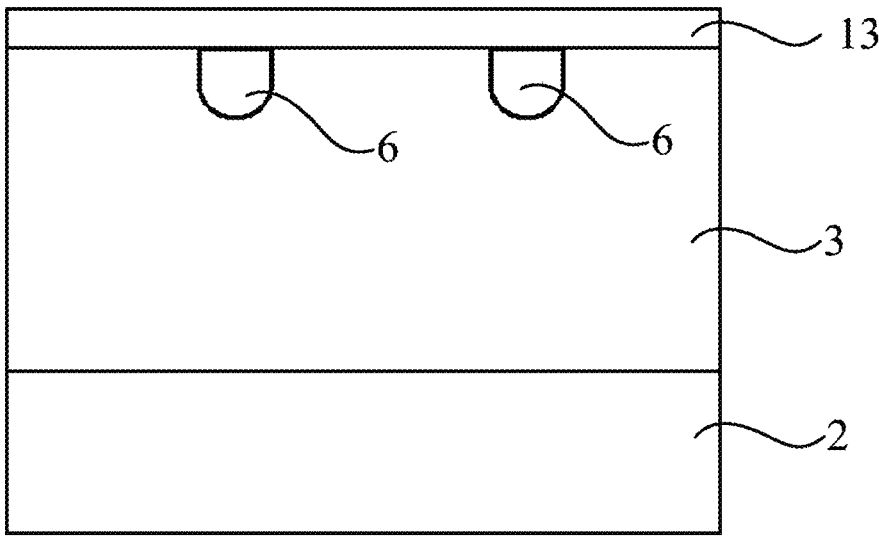
Figure 4B:
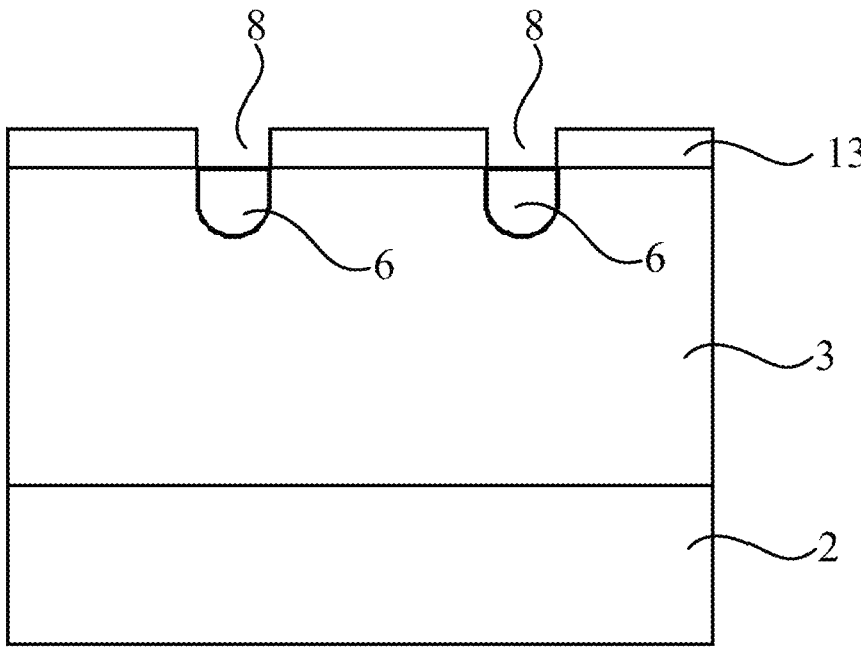
Figure 4C:
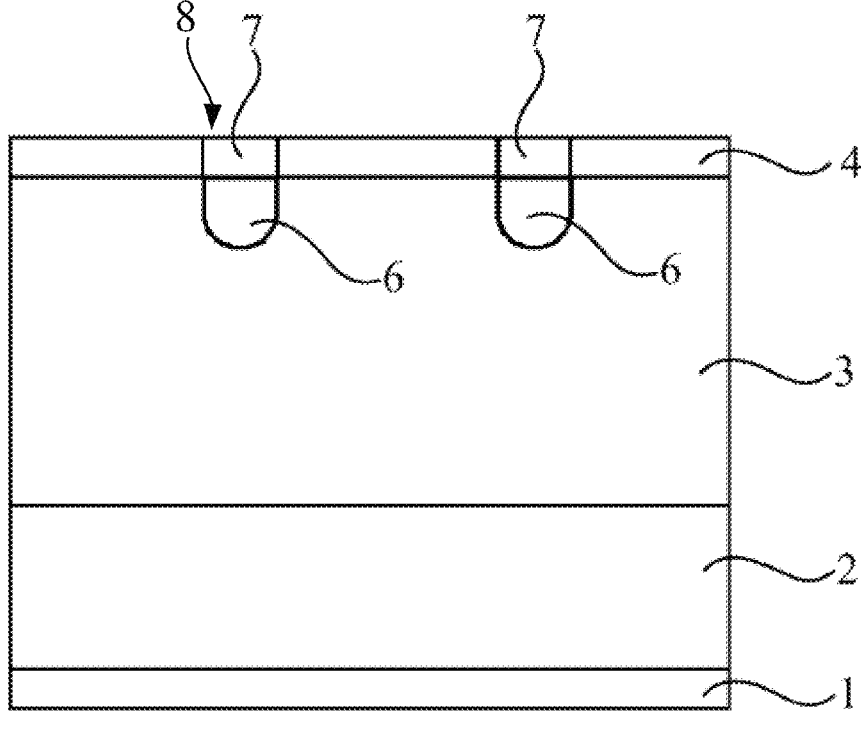

The present application also provides a method for preparing an MPS diode device, as shown in FIG. 1 to FIG. 5, the method includes:

S101: forming an epitaxial layer 3 on the substrate 2, wherein a side of the epitaxial layer 3 away from the substrate 2 includes an active layer formation region for forming an active region 6, as shown in FIG. 1;

S102: forming the active region 6 in the active formation region, as shown in FIG. 2e in combination with FIG. 2a, FIG. 2b, FIG. 2c and FIG. 2d;

S103: annealing treatment, as shown in FIG. 3;

S104: forming a buffer layer 4 on a side of the epitaxial layer 3 away from the substrate 2, and a band gap of the buffer layer being greater than a band gap of the epitaxial layer; patterning a part of the buffer layer 4 corresponding to the active region 6 to form a first hole 8 passing through the buffer layer 4, with reference to FIG. 4a, FIG. 4b and FIG. 4c;

S105: forming an ohmic metal layer 7 in the first hole 8, and forming a cathode electrode 1 on a side of substrate 2 away from epitaxial layer 3, as shown in FIG. 4c;

S106: forming an anode electrode 5 on a side of both of the buffer layer 4 and the ohmic metal layer 7 away from the epitaxial layer 3, as shown in FIG. 5.

In the above preparation method of the MPS diode device, a buffer layer 4 is formed on the epitaxial layer 3 and the buffer layer 4 is disposed between the epitaxial layer 3 and the anode electrode 5, the band gap of the buffer layer 4 is larger than the band gap of the epitaxial layer 3 and the material of the buffer layer 4 and the material of epitaxial layer 3 are allotropic structures, which can reduce the reverse leakage current of the MPS diode device while reducing the Schottky barrier height and thus reducing the forward conduction loss, so that the two performance parameters of reverse leakage current in the reverse bias direction and the forward working bias can be improved at the same time. As a result, the performance of the MPS diode device can be further enhanced.

Specifically, as shown in FIG. 2a, FIG. 2b, FIG. 2c and FIG. 2e, forming the active region 6 in the active layer formation region includes:

S201: forming a sacrificial oxide layer 9 on the surface of a side of the epitaxial layer 3 away from the substrate 2, as shown in FIG. 2a;

S202: forming a barrier layer 10 on a side of the sacrificial oxide layer 9 away from the epitaxial layer 3, and patterning a part of the barrier layer 10 corresponding to the active layer formation region to form a second hole 11 passing through the barrier layer 10, as shown in FIG. 2b and FIG. 2c;

S203: implanting ions into the second hole 11 to form the active region 6 in the active layer formation region in the epitaxial layer 3, as shown in FIG. 2d;

S204: removing the sacrificial oxide layer 9 and the barrier layer 10 to expose the epitaxial layer 3, as shown in FIG. 2e.

In the above step of forming the active region 6, in S201, a sacrificial oxide layer 9 is formed on the surface of a side of the epitaxial layer 3 away from the substrate 2. The sacrificial oxide layer 9 serves the function of buffering during the subsequent ion implantation of the active region 6 into the active formation region. To prevent the problems of surface amorphization of epitaxial layer 3 from direct implantation of high-energy particles during ion implantation and the subsequent problem of excessive leakage current, the thickness of sacrificial oxide layer 9 is 0.1 um and the material of sacrificial oxide layer is silicon dioxide; in S202, a barrier layer 10 is formed on a side of the oxide layer 9 away from the epitaxial layer 3, and patterning a part of the barrier layer 10 corresponding to the active layer formation region to form a second hole 11 passing through the barrier layer 10, and the barrier layer 10 is configured for preventing ion implantation into a part other than the active formation region, the material of the barrier layer 10 can be polysilicon or carbonized photoresist, etc., and its thickness can be 2 um; in S203, ions are implanted in the second hole 11 to form the active region 6 in the active layer formation region of the epitaxial layer 3. An energy and a dose of ion implantation are determined by the forward working bias required by the MPS diode device; in S204, the sacrificial oxide layer 9 and the barrier layer 10 are removed to expose the epitaxial layer 3, the purpose of sacrificial oxide layer 9 and barrier layer 10 is for the convenience of ion implantation, and can be removed after the active region 6 is formed, so as to carry out the subsequent preparation procedure.

Specifically, the ions are aluminum ions.

Specifically, in the MPS diode device prepared by the above preparation method, a material of the substrate 2 is n-type 3C—SiC, a material of the epitaxial layer 3 is n-type 3C—SiC, and a doping concentration of substrate 2 is higher than a doping concentration of epitaxial layer 3; a material of the buffer layer 4 is 4H—SiC.

The material of buffer layer 4 is 4H—SiC, the material of epitaxial layer 3 is n-type 3C—SiC, and the band gap of 4H—SiC is larger than the band gap of 3C—SiC, so that the modulation of the Schottky barrier height can be realized, and 4H—SiC and 3C—SiC are allotropic structures, so compared with using other wide band gap semiconductor materials as buffer layer 4, when using 4H—SiC as buffer layer 4, the stress problem from lattice mismatch at the interface between the 3C—SiC and 4H—SiC can be greatly improved, hence the interface state can be greatly reduced, so that the problem of excessive reverse leakage current caused by the interface state can be alleviated.

Specifically, annealing treatment includes:

S301: forming a carbon film 12 on a side of the epitaxial layer 3 away from the substrate 2, as shown in FIG. 3;

S302: performing a high temperature annealing treatment;

S303: removing the carbon film 12 to expose the epitaxial layer 3.

Annealing treatment needs to be performed after the active region 6 is prepared. On the one hand, annealing treatment can enhance the electrical activity of the doping ions in the active region 6, and on the other hand, annealing treatment can repair the lattice damage resulted from the ion implantation. In S301, the carbon film 12 is formed on a side of the epitaxial layer 3 away from the substrate 2, specifically, a photoresist of 1 um to 1.5 um is deposited and carbonized to form the carbon film 12. The carbon film 12 can alleviate the surface roughness problem on the epitaxial layer 3 resulted from Si sublimation during the following annealing treatment. In S302, high-temperature annealing treatment is performed, specifically, annealing treatment is performed at a temperature of 800-1000° C. for 30 minutes; in S303, the carbon film 12 is removed to expose the epitaxial layer 3, so as to facilitate the subsequent preparation process, the carbon film 12 can be removed by thermal oxidation method, that is, dry removal of the carbon film 12 at a temperature of 600-800° C.

Specifically, the buffer layer 4 is a quantum dot layer.

Adopting the quantum dot layer can better modulate the Schottky barrier height, such that the MPS diode device can achieve better performance.

Specifically, as shown in FIGS. 4*a*, 4*b* and 4*c*, the formation method of the quantum dot layer is:

S401: growing the buffer film layer 13 on a side of the epitaxial layer 3 away from the substrate 2 by a sublimation method at a temperature higher than 2000° C., as shown in FIG. 4*a;*

S402: patterning a part of the buffer film layer 13 corresponding to the active region 6 to form a first hole 8 passing through the buffer film layer 13, as shown in FIG. 4*b;*

S403: performing annealing treatment to the buffer film layer 13 to form a quantum dot layer, as shown in FIG. 4*c*.

In the preparation process of the quantum dot layer, firstly, it is necessary to grow the buffer film layer 13 on a side of the epitaxial layer 3 away from the substrate 2 by the sublimation method under the condition with a temperature higher than 2000° C. Since the material of the epitaxial layer 3 is n-type 3C—SiC, the material of the buffer film layer 13 can adopt 4H—SiC, which has a allotropic structure to 3C—SiC but with a larger band gap than 3C—SiC, thereby the Schottky barrier height can be adjusted and the interface state can be reduced, hence the two performance parameters of leakage current in the reverse bias direction and forward working bias can be improved at the same time. In S403, annealing treatment can be performed on the buffer film layer 13 to form a quantum dot layer. By changing the structure of the buffer film layer 13 into a quantum dot layer through the annealing treatment and adjusting the shape and size of the quantum dots in the quantum dot layer by controlling the annealing temperature, the modulation of the Schottky barrier height can be further realized.

When forming the quantum dot layer, the buffer film layer 13 needs to be formed before the annealing treatment, and the annealing treatment is also required when the ohmic metal layer 7 is formed in the first hole 8 of the buffer layer 4, these two annealing treatments can be combined into one. Moreover, the cathode electrode 1 and the ohmic metal layer 7 can also be formed at the same time, so the quantum dot layer, the cathode electrode 1 and the ohmic metal layer 7 can be formed at the same time. The details are as following: as shown in FIG. 4*a*, firstly, the buffer film layer 13 is formed; secondly as shown in FIG. 4*b*, the first hole 8 is formed on buffer film layer 13; then as shown in FIG. 4*c*, the ohmic metal layer 7 is formed in first hole 8, the cathode electrode 1 is formed on a side of substrate 2 away from the epitaxial layer 3, and then the annealing treatment is performed at a temperature of 800-1000° C. to form an ohmic contact and the buffer film layer 13 is processed into a quantum dot layer. Combining two annealing treatments can spare the preparation procedure and save the preparation time.

Electron beam evaporation technology can be adopted for the ohmic metal layer 7 to deposit a layer of 1 um titanium and can also be adopted for the preparation of cathode electrode 1 to deposit a layer of 1 um titanium. The material of cathode electrode 1 can be nickel or aluminum or other metal materials. As shown in FIG. 5, the preparation of anode electrode 5 was performed by depositing metal aluminum and annealing at a temperature of 300-500° C. to form Schottky contacts.

Obviously, those skilled in the art can make various changes and modifications to the examples of the present application without departing from the spirit and scope of the present application. Thus, provided that these modifications and variations of the present application fall within the scope of the claims of the present application and their equivalents, the present application is also intended to cover such modifications and variations.

The invention claimed is:

1. A merge pin Schottky (MPS) diode device, comprising a plurality of primitive cells arranged in parallel, wherein each of the plurality of primitive cells comprises a cathode electrode, a substrate, an epitaxial layer, a buffer layer and an anode electrode, and the substrate, the epitaxial layer, the buffer layer and the anode electrode are all sequentially formed on the cathode electrode, two active regions are formed on a side of the epitaxial layer away from the substrate, a band gap of the buffer layer is greater than a band gap of the epitaxial layer, and a material of the buffer layer and a material of the epitaxial layer are allotropes, and a first hole is arranged in a part, corresponding to the active region, of the buffer layer, and an ohmic metal layer is disposed in the first hole.

2. The MPS diode device according to claim 1, wherein the buffer layer is a nanostructure layer.

3. The MPS diode device according to claim 2, wherein the buffer layer is a quantum dot layer.

4. The MPS diode device according to claim 3, wherein a shape of quantum dot in the quantum dot layer is cylindrical, and a bottom surface of the quantum dot contacts with the epitaxial layer.

5. The MPS diode device according to claim 3, wherein a shape of quantum dot in the quantum dot layer is spherical.

6. The MPS diode device according to claim 3, wherein a shape of quantum dot in the quantum dot layer is convex, and the quantum dot comprise a tangent plane perpendicular to a direction of the epitaxial layer, and a shape of a contour line on a side of the tangent plane away from the epitaxial layer is in a shape of parabola.

7. The MPS diode device according to claim 1, wherein a material of the substrate is N-type 3C—SiC, a material of the epitaxial layer is N-type 3C—SiC, a doping concentration of the substrate is higher than a doping concentration of the epitaxial layer, and a material of the buffer layer is 4H—SiC.

8. The MPS diode device according to claim 1, wherein a material of the ohmic metal layer is titanium.

9. The MPS diode device according to claim 1, wherein a thickness of the ohmic metal layer is 1 um.

10. A preparation method of an MPS diode device, comprising:

forming an epitaxial layer on a substrate, wherein a side of the epitaxial layer away from the substrate comprises an active layer formation region for forming an active region;

forming the active region in the active formation region;

annealing treatment;

forming a buffer layer on a side of the epitaxial layer away from the substrate, and a band gap of the buffer layer being greater than a band gap of the epitaxial layer, and patterning a part of the buffer layer corresponding to the active region to form a first hole passing through the buffer layer;

forming an ohmic metal layer in the first hole;

forming a cathode electrode on a side of the substrate away from the epitaxial layer; and forming an anode electrode on a side of both of the buffer layer and the ohmic metal layer away from the epitaxial layer.

11. The preparation method according to claim 10, wherein the forming the active region in the active layer formation region comprises:

forming a sacrificial oxide layer on a surface of the epitaxial layer away from the substrate;

forming a barrier layer on a side of the sacrificial oxide layer away from the epitaxial layer, and patterning a part of the barrier layer corresponding to the active layer formation region to form a second hole passing through the barrier layer;

implanting ions into the second hole to form an active region in the active layer formation region of the epitaxial layer; and removing the sacrificial oxide layer and the barrier layer to expose the epitaxial layer.

12. The preparation method according to claim 11, wherein the ions are aluminum ions.

13. The preparation method according to claim 12, wherein a material of the substrate is N-type 3C—SiC, a material of the epitaxial layer is N-type 3C—SiC, a doping concentration of the substrate is higher than a doping concentration of the epitaxial layer, and a material of the buffer layer is 4H—SiC.

14. The preparation method according to claim 10, wherein the annealing treatment comprises:

forming a carbon film on a side of the epitaxial layer away from the substrate;

performing a high temperature annealing treatment; and removing the carbon film to expose the epitaxial layer.

15. The preparation method according to claim 10, wherein the buffer layer is a nanostructure layer.

16. The preparation method according to claim 15, wherein the buffer layer is a quantum dot layer; the buffer layer is prepared by:

growing a buffer film layer on a side of the epitaxial layer away from the substrate by a sublimation method at a temperature higher than 2000° C.; and subjecting the buffer film layer to annealing treatment to form the buffer layer.

* * * * *